(12) United States Patent
Babb et al.

(10) Patent No.: US 7,216,241 B2
(45) Date of Patent: May 8, 2007

(54) SELF-TESTING POWER SUPPLY WHICH INDICATES WHEN AN OUTPUT VOLTAGE IS WITHIN TOLERANCE WHILE NOT COUPLED TO AN EXTERNAL LOAD

(75) Inventors: Samuel Martin Babb, Fort Collins, CO (US); Jeffrey Scott Weaver, Fort Collins, CO (US); Stacie F. Mathis, Greeley, CO (US); Kelly J. Pracht, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 417 days.

(21) Appl. No.: 10/903,429

(22) Filed: Jul. 30, 2004

(65) Prior Publication Data

US 2006/0026420 A1   Feb. 2, 2006

(51) Int. Cl.
*G06F 1/00* (2006.01)
*G06F 11/00* (2006.01)
*G01R 21/00* (2006.01)

(52) U.S. Cl. .......................... 713/300; 714/22; 702/60
(58) Field of Classification Search ................ 323/234; 702/60; 713/300; 714/14, 22
See application file for complete search history.

(56) References Cited

U.S. PATENT DOCUMENTS

| | | | | |
|---|---|---|---|---|
| 5,023,481 A | * | 6/1991 | Tero et al. | 327/488 |
| 5,668,417 A | * | 9/1997 | Wiscombe et al. | 307/64 |
| 5,710,701 A | * | 1/1998 | Brown | 700/80 |
| 5,764,547 A | * | 6/1998 | Bilich et al. | 713/321 |
| 5,978,593 A | * | 11/1999 | Sexton | 710/1 |
| 6,275,162 B1 | * | 8/2001 | Lo et al. | 340/636.1 |
| 6,625,742 B1 | * | 9/2003 | Owhadi et al. | 713/340 |
| 6,629,045 B2 | * | 9/2003 | Chao et al. | 702/60 |
| 6,772,357 B2 | * | 8/2004 | Billick et al. | 713/340 |
| 7,000,147 B2 | * | 2/2006 | Hsu | 714/22 |

OTHER PUBLICATIONS

ATX Specification. Version 2.2. pp. 1-26.
ATX12V Power Supply Design Guide. Version 1.3. pp. 1-38.

* cited by examiner

*Primary Examiner*—Chun Cao
*Assistant Examiner*—Mark Connolly
(74) *Attorney, Agent, or Firm*—Kevin M. Hart

(57) ABSTRACT

A power supply unit according to a preferred embodiment of the invention is self testing. The power supply unit is enabled to function with no external loads applied, and includes a visual indicator of whether or not one or more voltage outputs of the power supply unit is within tolerance. To benefit from the self-test feature, a user in the field may simply unplug the power supply unit from all loads, plug the unit into an A/C source, and observe the visual indicator. If the visual indicator is lit, then the user may reasonably assume that the power supply unit is functioning correctly. But if the visual indicator is not lit, then the user may reasonably assume that the power supply unit is faulty.

6 Claims, 2 Drawing Sheets

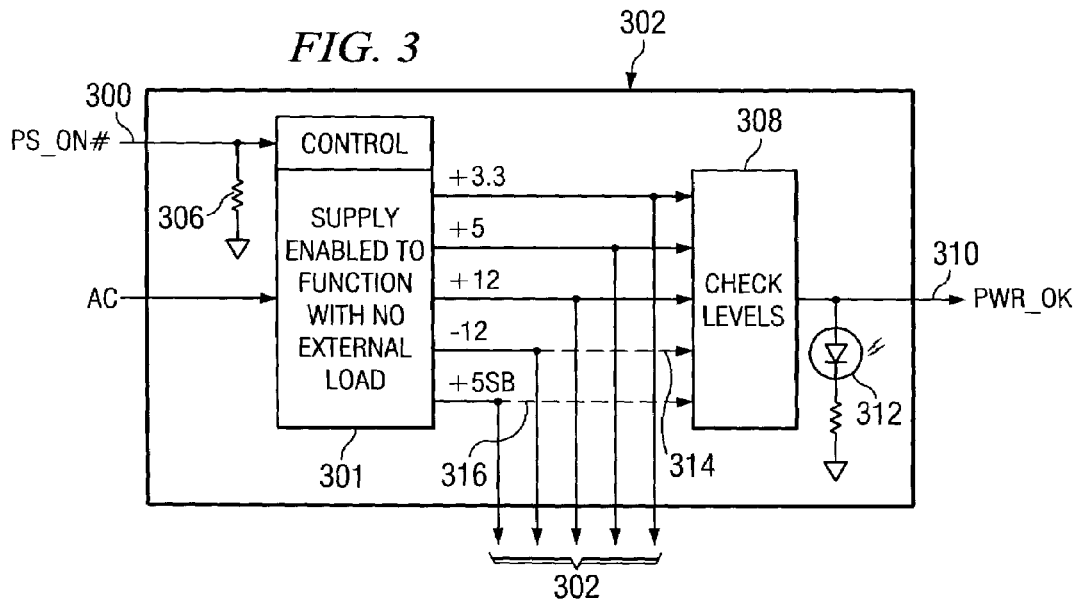
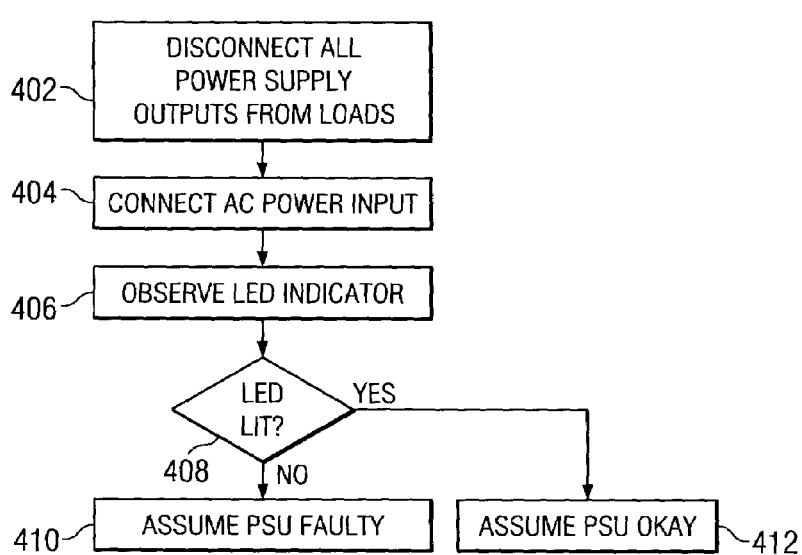

US 7,216,241 B2

SELF-TESTING POWER SUPPLY WHICH INDICATES WHEN AN OUTPUT VOLTAGE IS WITHIN TOLERANCE WHILE NOT COUPLED TO AN EXTERNAL LOAD

FIELD OF THE INVENTION

This invention relates to power supplies for computers.

BACKGROUND

One common method for troubleshooting computers in the field is simply to remove suspected faulty components and to replace them with known good ones. Removed components are often then returned to the manufacturer for testing and repair. As it happens, the majority of power supply units returned in this manner are found by the manufacturers to be operating correctly upon receipt. In such cases, the power supply unit should not have been removed and replaced. It would be desirable, therefore, to provide a means by which a computer power supply can be tested for proper operation conveniently in the field.

SUMMARY OF THE INVENTION

In one aspect, a power supply unit according to a preferred embodiment of the invention is self testing. The power supply unit is enabled to function with no external loads applied, and includes a visual indicator of whether or not one or more voltage outputs of the power supply unit is within tolerance. To benefit from the self-test feature, a user in the field may simply unplug the power supply unit from all loads, plug the unit into an A/C source, and observe the visual indicator. If the visual indicator is lit, then the user may reasonably assume that the power supply unit is functioning correctly. But if the visual indicator is not lit, then the user may reasonably assume that the power supply unit is faulty.

In another aspect, a power supply unit according to a preferred embodiment of the invention may be deployed in an ATX-compliant computer. To do so, an asserted-low PS_ON# signal may be equipped with a pull-down resistor instead of a pull-up resistor inside the power supply unit. When this is done, the power supply unit will continue to function in an ATX-compliant manner in the sense that the PS_ON# signal may still be used to turn the power supply unit on and off. But when the power supply unit is disconnected from all loads and the PS_ON# signal is open-circuited at the main motherboard connector, the pull-down resistor internal to the power supply unit asserts the PS_ON# signal so that the self-test feature is enabled.

In another aspect, the visual indicator may be provided by coupling a light device to a PWR_OK signal of the power supply unit.

BRIEF DESCRIPTION OF THE DRAWINGS

FIG. 3 is a schematic diagram illustrating a self-testing power supply unit according to a preferred embodiment of the invention.

FIG. 4 is a flow diagram illustrating a preferred method for utilizing the self-test feature of the power supply unit of FIG. 3.

DETAILED DESCRIPTION OF THE PREFERRED EMBODIMENTS

Figure 1:
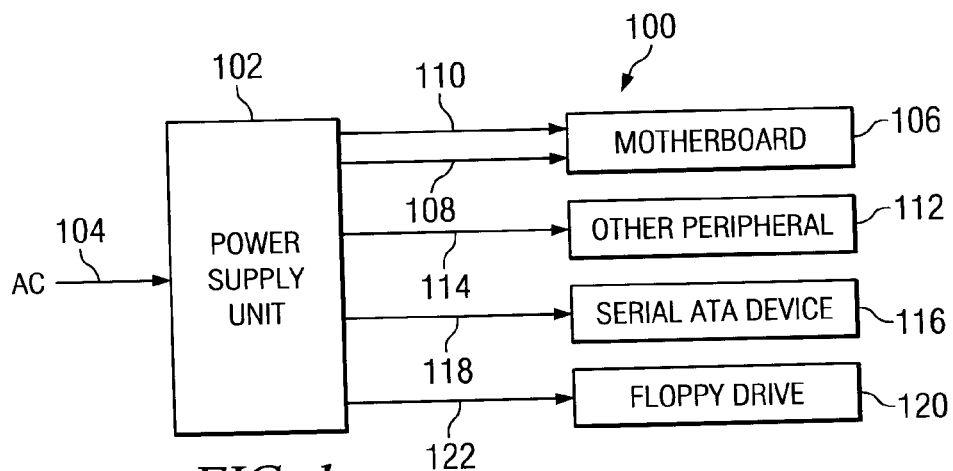
FIG. 1 is a schematic diagram illustrating a typical computer including a power supply unit according to the prior art.

FIG. 1 illustrates a typical computer 100 including a power supply unit 102 according to the prior art. Power supply unit 102 is plugged into an alternating current ("A/C") supply source 104 and generates a plurality of voltage outputs. The voltage outputs may be coupled via cables/connectors 108, 110, 114, 118, 120 to a number of consumer systems within computer 100 such as a motherboard 106, a floppy drive 120, a serial ATA device 116, and other peripheral devices 112. The selection of system components shown in the drawing is provided by way of illustration only; these or other system components may be utilized when deploying a power supply unit according to a preferred embodiment of the invention. Moreover, a power supply unit according to the invention may be deployed in a variety of different types of computer systems including those that are compliant with the popular ATX industry standard as well as those that are not.

Figure 2:
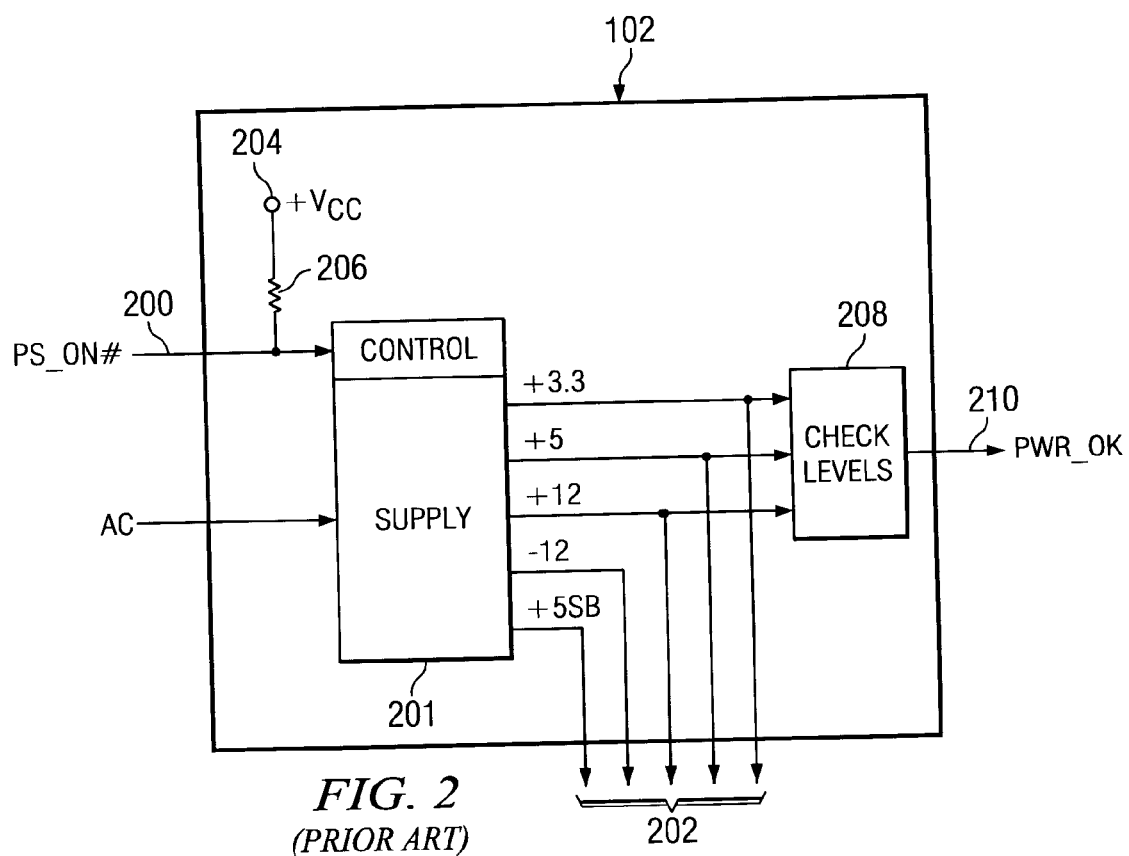
FIG. 2 is a schematic diagram illustrating the prior art power supply unit of FIG. 1 in more detail.

If computer system 100 is one that complies with the ATX standard, then voltage outputs 202 from supply 201 (referring now to FIG. 2) may be as shown, and one of cables/connectors 108, 110 may be coupled to the "main" power connector of motherboard 106. According to the ATX standard, the main power connector for the motherboard is to include an asserted-low PS_ON# signal 200 on one of its pins. PS_ON# signal 200 is used by circuitry on motherboard 100 to turn voltage outputs 202 on when PS_ON# is low and off when PS_ON# is high. The ATX standard specifies that PS_ON# signal 200 must be coupled to a TTL high voltage level 204 via a pull-up resistor 206 internal to power supply unit 102. In this manner, when the main power connector is unplugged from motherboard 100 so that PS_ON# signal 200 is open-circuited at the connector, the internal pull-up resistor 206 will unassert PS_ON# so that voltage outputs 202 of power supply unit 102 will turn off. The ATX standard also specifies that power supply unit 102 must include level checking circuitry 208 operable to generate a PWR_OK signal 210. PWR_OK signal 210 indicates whether or not the +3.3 VDC, the +5 VDC, and the +12 VDC voltage outputs are within tolerance.

FIG. 3 illustrates a self-testing power supply unit 302 according to a preferred embodiment of the invention. Power supply unit 302 has at least one voltage output 302 and is operable to function with no external loads applied to any of voltage outputs 302. This may be accomplished by any of a variety of known means. For example, supply 301 may be of the synchronous rectifier type, or supply 301 may be equipped with internal loads for this purpose. Any other suitable means may be employed. Level-checking circuitry 308 may be coupled to at least one of voltage outputs 302 and may be operable to assert PWR_OK signal 310 to indicate whether or not at least one of voltage outputs 302 is within tolerance. Finally, a visual indicator should be coupled to PWR_OK signal 310 to so that the state of PWR_OK signal 310 is readily observable by a user of power supply unit 302. Any type of visual indicator may be used for this purpose. In one class of embodiments, the visual indicator may be a light device such as a light bulb or a light-emitting diode 312. Depending on which type of visual indicator is employed, the circuitry for coupling the visual indicator to PWR_OK signal 310 may, of course, vary from that shown in the drawing.

If power supply unit 302 is to be deployed in an ATX-style computer system such as computer 100, then an asserted-low control input 300 should be provided and should be operable to turn voltage outputs 302 on and off. Pull-up resistor 206, however, should not be present in power supply unit 302. Instead, pull-down resistor 306 should be provided to pull signal 300 to ground when the main power connector is unplugged from the motherboard and signal 300 is open-circuited at the connector. In this manner, power supply unit 302 will turn voltage outputs 302 on when A/C power is supplied and the main power connector is unplugged from the motherboard. But when the main power connector is plugged into the motherboard, the motherboard may overcome the pull-down provided by resistor 306 so that it may bring signal 300 high and low to turn voltage outputs 302 off and on as needed.

In order to ensure the latter functionality, it may preferable to choose a value for resistor 306 so that the internal power supply pull-down is "weak." Some motherboards utilize a pull-up resistor on the PS_ON# signal to unassert the signal, together with an open-collector driver to assert the signal. Other motherboards use a totem pole circuit to assert and unassert the signal, but even motherboards using a totem pole circuit may also utilize a pull-up. Therefore, as an example, a value on the order of 100 k-ohm for resistor 306 may be preferable to handle cases in which a motherboard pull-up on the order of 1 k-ohm is employed. Other values may be chosen for resistor 306 as necessary given the characteristics of the circuitry on a given motherboard.

In an ATX-compliant system, level-checking circuitry 308 should be coupled at least to the +3.3 VDC, +5 VDC, and the +12 VDC voltage outputs so that PWR_OK signal 310 will indicate whether or not all of those voltage outputs are within tolerance. Optionally, level-checking circuitry may be coupled to the −12 VDC and/or the +5 VDC standby voltage outputs so that PWR_OK signal 310 may indicate the status of those outputs as well as the others.

To utilize the self-test feature provided by power supply unit 302, a user of the host computer may operate according to method 400 illustrated in FIG. 4. In step 402, the user disconnects all of voltage outputs 302 from their loads by unplugging all of the connectors between power supply unit 302 and the host computer. In step 404, the user plugs power supply unit 302 into an A/C source. He then simply observes the state of visual indicator 312 in step 406 and notes whether or not the indicator is lit (step 408). If so, then he may reasonably assume that power supply unit 302 is operating correctly (step 412). If not, then he may reasonably assume that power supply unit 302 is faulty (step 410).

While the invention has been described in detail in relation to preferred embodiments thereof, the described embodiment has been presented by way of example and not by way of limitation. It will be understood by those skilled in the art that various changes may be made in the form and details of the described embodiment without deviating from the spirit and scope of the invention as defined by the appended claims.

What is claimed is:

1. A self-testing power supply unit for a computer, comprising:
    a power supply having at least one voltage output and operable to function with no external load applied to the voltage output;
    level-checking circuitry coupled to the voltage output and operable to assert a PWR_OK signal when the voltage output is within tolerance;
    a visual indicator coupled to the PWR_OK signal; and
    an asserted-low control input operable to turn the voltage output on and off, wherein the asserted-low control input is coupled to ground inside the power supply via a pull-down resistor.

2. The self-testing power supply unit of claim 1, wherein:
    the asserted-low control input is coupled to a PS_ON# pin of a main power connector for coupling to a motherboard of the computer.

3. The self-testing power supply unit of claim 1, wherein:
    the visual indicator is a light device.

4. The self-testing power supply unit of claim 3, wherein:
    the light device is a light-emitting diode.

5. The self-testing power supply unit of claim 1, wherein:
    the power supply has a plurality of voltage outputs; and
    the level-checking circuitry is coupled to all of the plural voltage outputs and asserts the PWR_OK signal when all of the plural voltage outputs are within tolerance.

6. A method of testing a power supply unit of a computer, comprising:
    unplugging the power supply unit from all external loads;
    plugging the power supply unit into an A/C source;
    waiting for a pull-down resistor inside the power supply unit to pull low an asserted-low control input of the power supply unit, the control input operable, when asserted, to turn on a voltage output of the power supply unit;
    waiting for a level-checking circuitry inside the power supply unit to determine whether the voltage output is within tolerance;
    observing a visual indicator on the power supply unit; and
    if the visual indicator is lit, concluding that the power supply unit is functioning correctly;
    but if the visual indicator is not lit, concluding that the power supply unit is faulty.

* * * * *